(12) United States Patent
Chien et al.

(10) Patent No.: US 10,529,654 B2
(45) Date of Patent: *Jan. 7, 2020

(54) WIRE SUPPORT FOR A LEADFRAME

(71) Applicant: TEXAS INSTRUMENTS INCORPORATED, Dallas, TX (US)

(72) Inventors: Yuh-Harng Chien, Taipei-Hsien (TW); Chih-Chien Ho, Taipei Hsien (TW); Steven Su, Tainan (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,148

(22) Filed: Sep. 26, 2018

(65) Prior Publication Data

US 2019/0027429 A1 Jan. 24, 2019

Related U.S. Application Data

(60) Continuation of application No. 15/447,406, filed on Mar. 2, 2017, now Pat. No. 10,121,733, which is a
(Continued)

(51) Int. Cl.
*H01L 23/495* (2006.01)
*H01L 23/31* (2006.01)
(Continued)

(52) U.S. Cl.
CPC .... *H01L 23/49541* (2013.01); *H01L 23/3121* (2013.01); *H01L 23/49503* (2013.01); *H01L 23/49551* (2013.01); *H01L 23/49575* (2013.01); *H01L 23/49861* (2013.01); *H01L 24/32* (2013.01); *H01L 24/48* (2013.01); *H01L 24/73* (2013.01); *H01L 25/0655* (2013.01); *H01L 25/18* (2013.01); *H01L 21/56* (2013.01); *H01L 24/45* (2013.01); *H01L 2224/05554* (2013.01); *H01L 2224/05599* (2013.01); *H01L 2224/2919* (2013.01); *H01L 2224/32245* (2013.01); *H01L 2224/45144* (2013.01); *H01L 2224/45147* (2013.01); *H01L 2224/48137* (2013.01); *H01L 2224/48138* (2013.01); *H01L 2224/49175* (2013.01); *H01L 2224/73265* (2013.01); *H01L 2224/85399* (2013.01); *H01L 2924/00014* (2013.01); *H01L 2924/0665* (2013.01); *H01L 2924/10253* (2013.01); *H01L 2924/10329* (2013.01); *H01L 2924/17747* (2013.01)

(58) Field of Classification Search
CPC . H01L 22/12; H01L 29/7875; H01L 29/7878; H01L 51/5271; H01L 51/5268
See application file for complete search history.

(56) References Cited

U.S. PATENT DOCUMENTS 10,121,733 B2 * 11/2018 Chien ............... H01L 23/49541
2012/0238056 A1 9/2012 Numazaki
2015/0243588 A1 8/2015 Edwards et al.

* cited by examiner

*Primary Examiner* — Dung A. Le
(74) *Attorney, Agent, or Firm* — Rose Alyssa Keagy; Charles A. Brill; Frank D. Cimino (57) ABSTRACT

A leadframe includes a plurality of interconnected support members. A pair of die pads is connected to the support members and configured to receive a pair of dies electrically connected by at least one wire. A support bracket extends between the die pads and includes a surface for maintaining the at least one wire at a predetermined distance from the die pads during overmolding of the leadframe.

17 Claims, 6 Drawing Sheets

Related U.S. Application Data division of application No. 14/985,127, filed on Dec. 30, 2015, now Pat. No. 9,627,331.

(51) Int. Cl.
*H01L 23/498* (2006.01)
*H01L 23/00* (2006.01)
*H01L 25/065* (2006.01)
*H01L 25/18* (2006.01)
*H01L 21/56* (2006.01)

WIRE SUPPORT FOR A LEADFRAME

CROSS REFERENCE TO RELATED APPLICATION

This application is a continuation of and claims priority to U.S. patent application Ser. No. 15/447,406 filed on Mar. 2, 2017, which is a divisional of and claims priority to U.S. patent application Ser. No. 14/985,127 now U.S. Pat. No. 9,627,331 issued on Apr. 18, 2017, the entirety of all is incorporated herein by reference.

BACKGROUND

The present invention relates generally to leadframes and, in particular, relates to a wire support bracket for a leadframe

TECHNICAL FIELD

Circuit boards include a leadframe and a series of electrical components electrically connected by wires. Once the components are assembled and connected, an electrically insulating material is overmolded over the circuit board to form the finished product and protect the components therein.

SUMMARY

In one example, a leadframe includes a plurality of interconnected support members. A pair of die pads is connected to the support members and configured to receive a pair of dies electrically connected by at least one wire. A support bracket extends between the die pads and includes a surface for maintaining the at least one wire at a predetermined distance from the die pads during overmolding of the leadframe.

In another example, a circuit board includes a leadframe having a plurality of interconnected support members a pair of die pads connected to the support members. A support bracket extends between the die pads and includes a surface. A pair of dies is secured to the die pads. At least one wire electrically connects the dies together. The surface of the support bracket supports the at least one wire to maintain the at least one wire at a predetermined distance from the die during overmolding of the circuit board.

In another example, a method of forming a circuit board includes molding a leadframe having a plurality of interconnected support members, a pair of die pads connected to the support members, and a support bracket extending between the die pads. The support bracket has a surface. A pair of dies is secured to the die pads. The dies are electrically connected with at least one wire such that the at least one wire extends over the surface of the support bracket. The circuit board is overmolded with an electrically insulating material such that the surface of the support bracket spaces the at least one wire from the dies by a predetermined distance following molding.

Other objects and advantages and a fuller understanding of the invention will be had from the following detailed description and the accompanying drawings.

DETAILED DESCRIPTION

Figure 1:
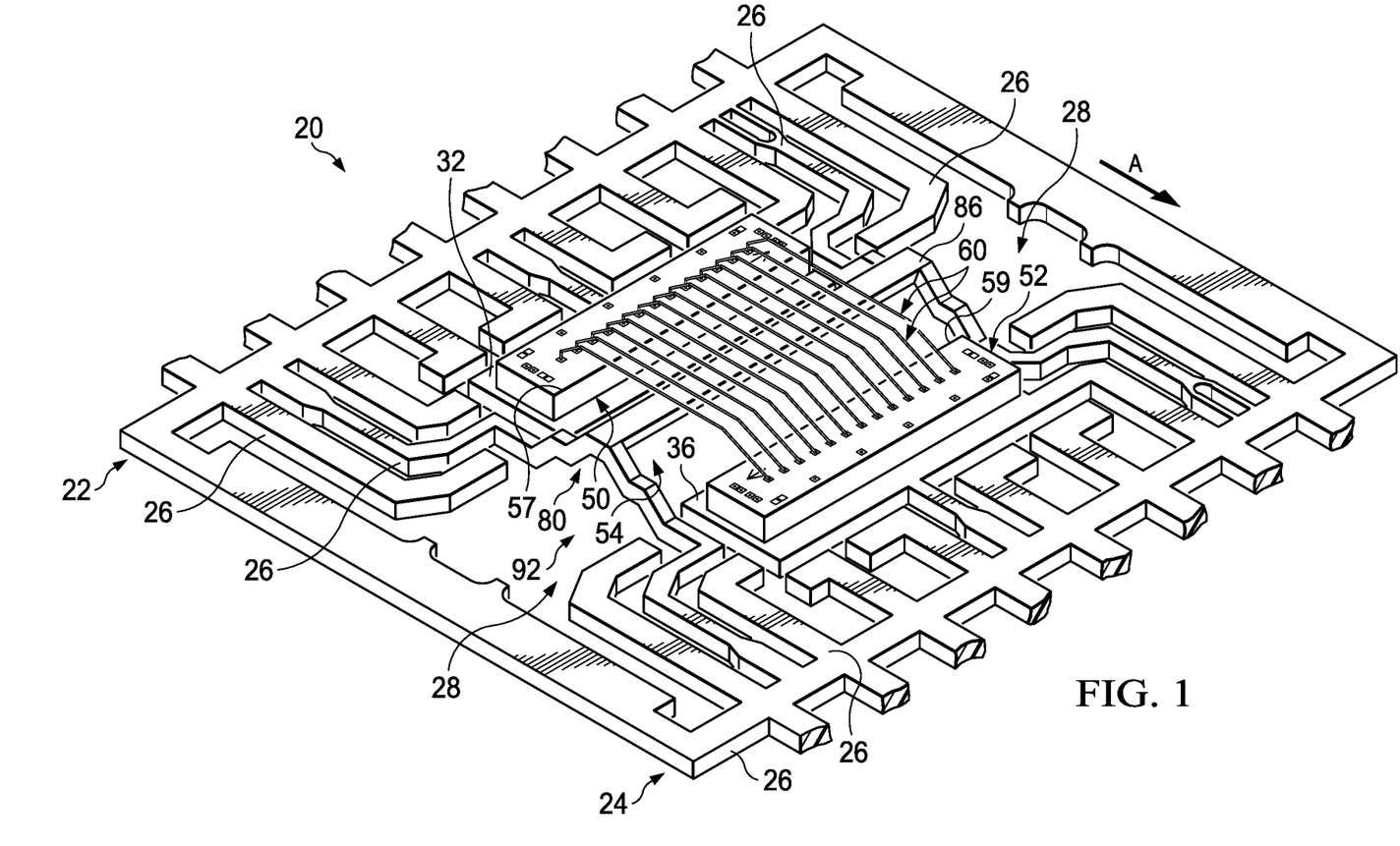
FIG. 1 illustrates a front isometric view of an example leadframe for a circuit board.

The present invention relates generally to leadframes and, in particular, relates to a wire support bracket for a leadframe. FIGS. 1-4 illustrate one example leadframe 20 for a circuit board, e.g., a smaller aligned integrated circuit (SOIC). Referring to FIG. 1, the leadframe 20 extends generally in a plane from a first end 22 to a second end 24 and includes a series of interconnected support members 26. The support members 26 form a network having a plurality of spaces or gaps 28. The leadframe 20 is formed from a plate of electrically conductive material, e.g., copper or copper-alloy, that is stamped and/or etched to define the support members 26 and spaces 28 in a desired configuration.

A pair of die pads 32, 36 formed integrally with the support members 26 are provided between the first and second ends 22, 24. The die pads 32, 36 are illustrated as rectangular but could have any shape. The die pads 32, 36 extend parallel to one another and are spaced apart by a passage or gap 54. Although two die pads 32, 36 are shown the leadframe 20 could include more than two die pads.

First and second dies 50, 52 are secured to the pair of die pads 32, 36 with an epoxy or the like. Each die 50, 52 constitutes a block of semiconductor material, e.g., electronic-grade silicon or gallium-arsenide, in which one or more functional circuits (not shown) is provided. The first die 50 includes a planar top surface 56 having an inner edge 57. The second die 52 includes a planar top surface 58 having an inner edge 59. In one example, the dies 50, 52 are identical and the top surfaces 56, 58 are co-planar. Alternatively, the dies 50, 52 are different and/or the top surfaces 56, 58 extend parallel to one another. As shown, the first die 50 is a ball bonded die and the second die 52 is a stitch bonded die.

One or more electrically conductive wire or wire loops 60 extends between the dies 50, 52 to electrically connect the dies to one another. As shown, a plurality of wires 60 extends between the dies 50, 52. Each wire 60 includes a first end 62, a second end 64, and a middle portion 66 extending from the first end to the second end. The first end 62 of each wire 60 is electrically connected to the first die 50. The second end 64 of each wire 60 is electrically connected to the second die 52. The wires 60 are secured to the dies 50, 52 such that the wires 60 extend substantially parallel to one another, with the middle portion 66 of each wire extending over the gap 54 between the die pads 32, 36. In one example, the wires 60 are gold wires, although other materials, such as copper, can be used to form the wires.

A support bracket 80 extends between the die pads 32, 36 for supporting the middle portions 66 of the wires 60 between the dies 50, 52. The support bracket 80 extends along a centerline 81 from a first end 82 to a second end 84. At least one middle portion 86 extends between the first and second ends 82, 84. In one example, the middle portion 86 extends parallel to the die pads 32, 36 and dies 50, 52. The first end 82, second end 84, and middle portion 86 extend out of the plane of the support members 26 and die pads 32, 36.

Figure 2A:
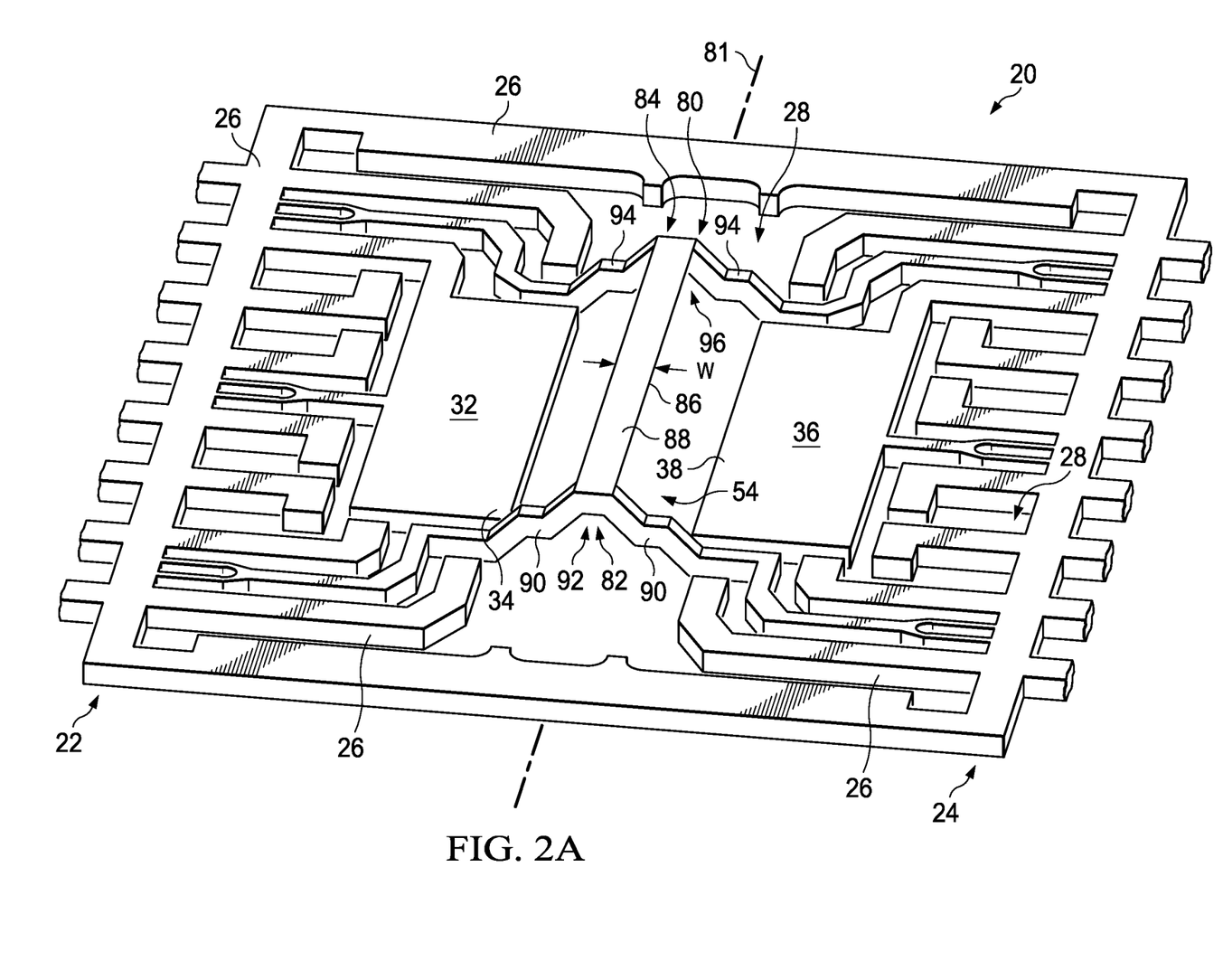
FIG. 2A illustrates the leadframe of FIG. 1 following a first stage of manufacturing.

The first end 82 of the support bracket 80 includes a pair of legs 90 connected to the support members 26 and/or the die pads 32, 36 on one side of the dies 50, 52 (the lower side as shown in FIG. 2A). An opening 92 extends between the legs 90 to the gap 54. The legs 90 extend from the support members 26 towards one another and interconnect at the centerline 81.

The second end 84 of the support bracket 80 includes a pair of legs 94 connected to the support members 26 and/or the die pads 32, 36 on the other side of the dies 50, 52 (the upper side as shown in FIG. 2A). An opening 96 extends between the legs 94 to the gap 54. The legs 94 extend from the support members 26 towards one another and interconnect at the centerline 81. The legs 90, 94 can have any shape suitable for connecting the support member 80 to the rest of the leadframe 20. As shown, the legs 90 form a triangular first end 82 and the legs 92 form a triangular second end 84.

Figure 2B:
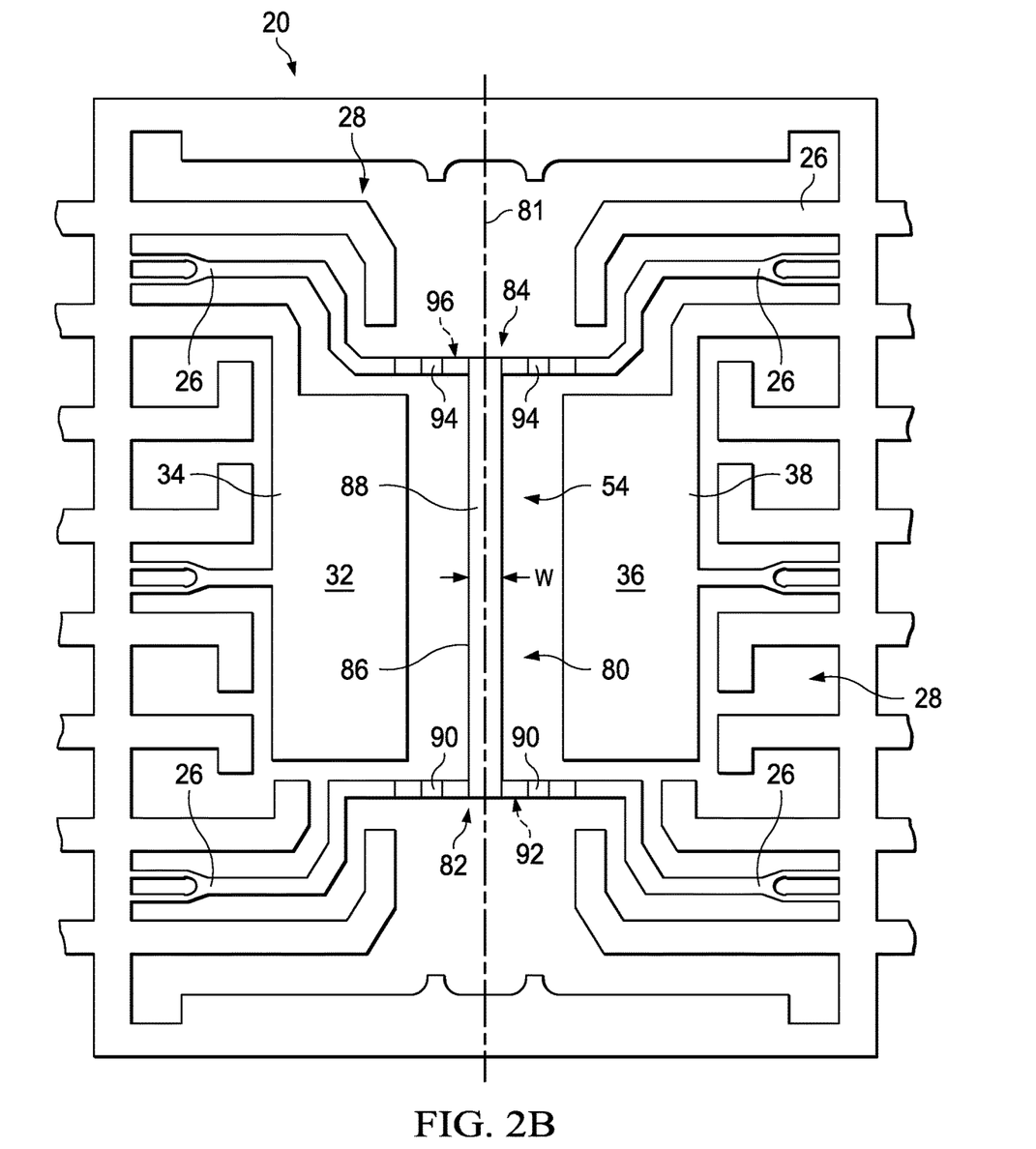
FIG. 2B illustrates a top view of the leadframe of FIG. 2A.

The middle portion 86 constitutes a single, planar member having a top surface 88 extending along the centerline 81 and positioned equidistantly between the dies 50, 52. In another example, the middle portion 86 can constitute multiple planar members that extend parallel to one another and are evenly/unevenly spaced between the dies 50, 52 (not shown). As shown in FIGS. 2A-2B, the middle portion 86 has a predetermined width W, e.g., on the order of about 4 mm. Where the middle portion 86 constitutes multiple planar members, each middle portion will have the same width W. The middle portion 86 of the support bracket 80 is coated with a solder resistant layer of, for example, a polymer, to prevent the wires 60 from shorting.

Figure 2C:
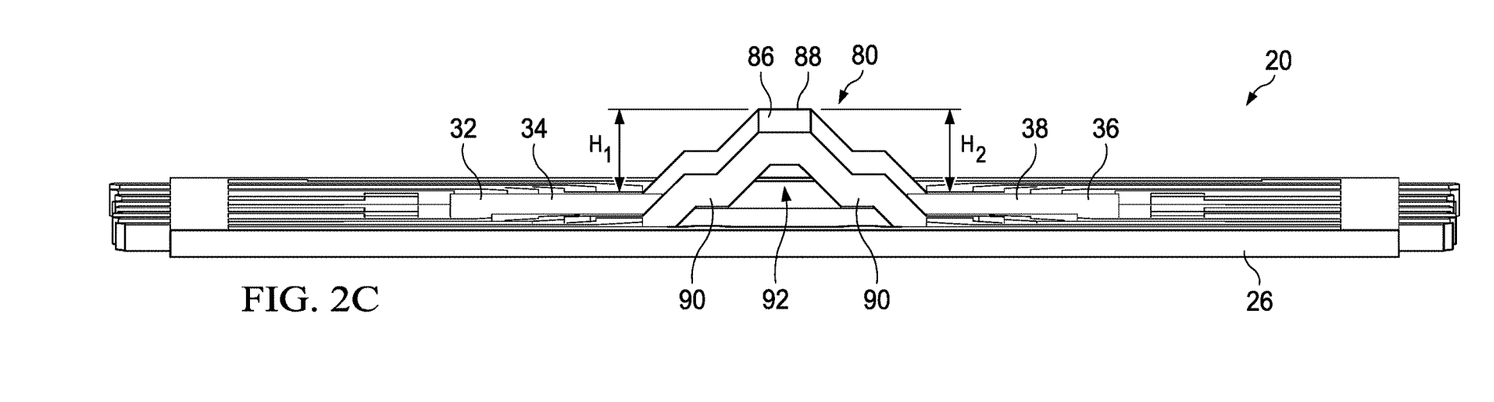
FIG. 2C illustrates a front view of the leadframe of FIG. 2A.

As shown in FIG. 2C, the top surface 88 of the middle portion 86 is positioned a predetermined height $H_1$ from the top surface 34 of the first die pad 32. The top surface 88 is positioned a predetermined height $H_2$ from the top surface 38 of the second die pad 36. As shown, the heights $H_1$, $H_2$ are identical and can be, for example, about 630 μm, although the height(s) can be greater or less to meet design criterion.

Figure 3:
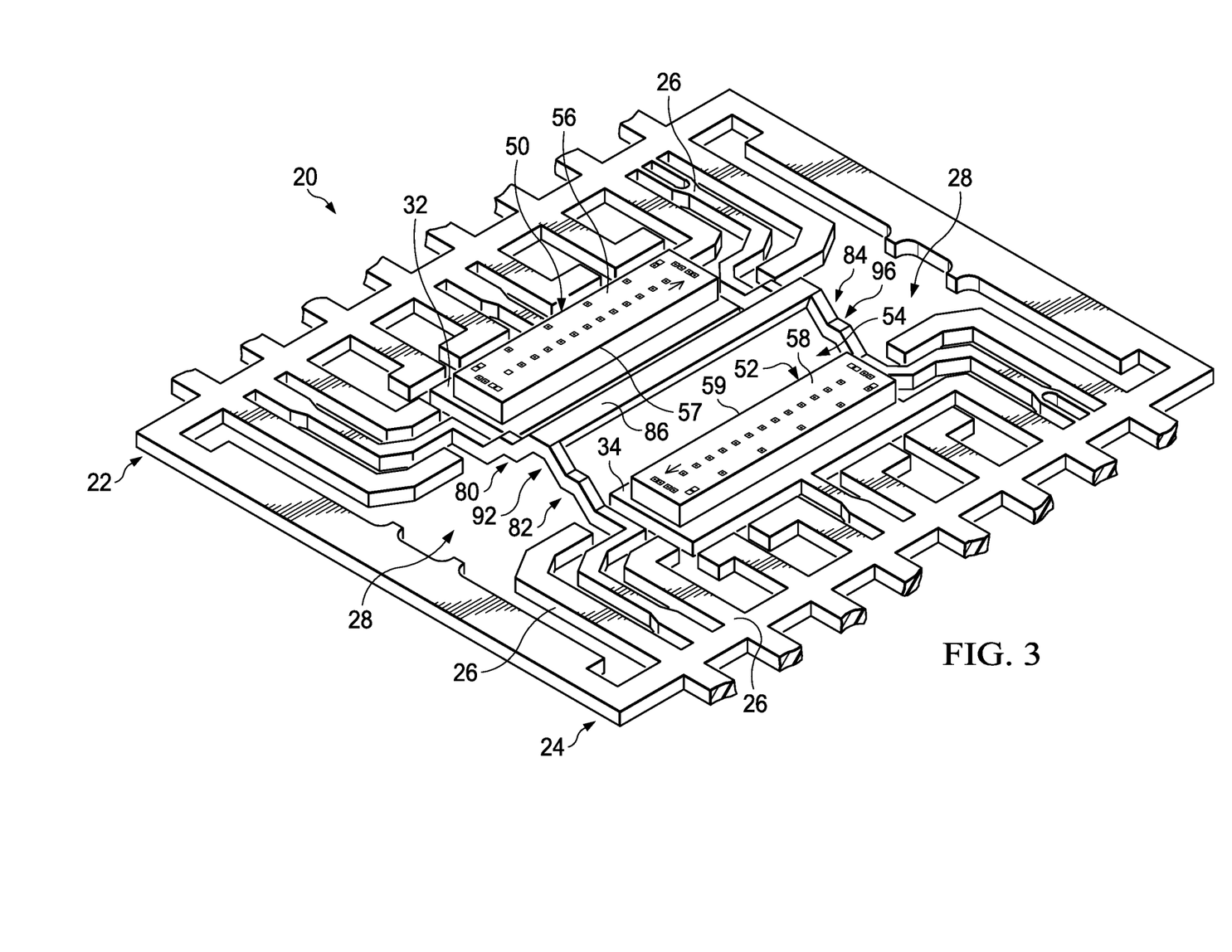
FIG. 3 illustrates the leadframe of FIG. 1 following a second stage of manufacturing.
Figure 4A:
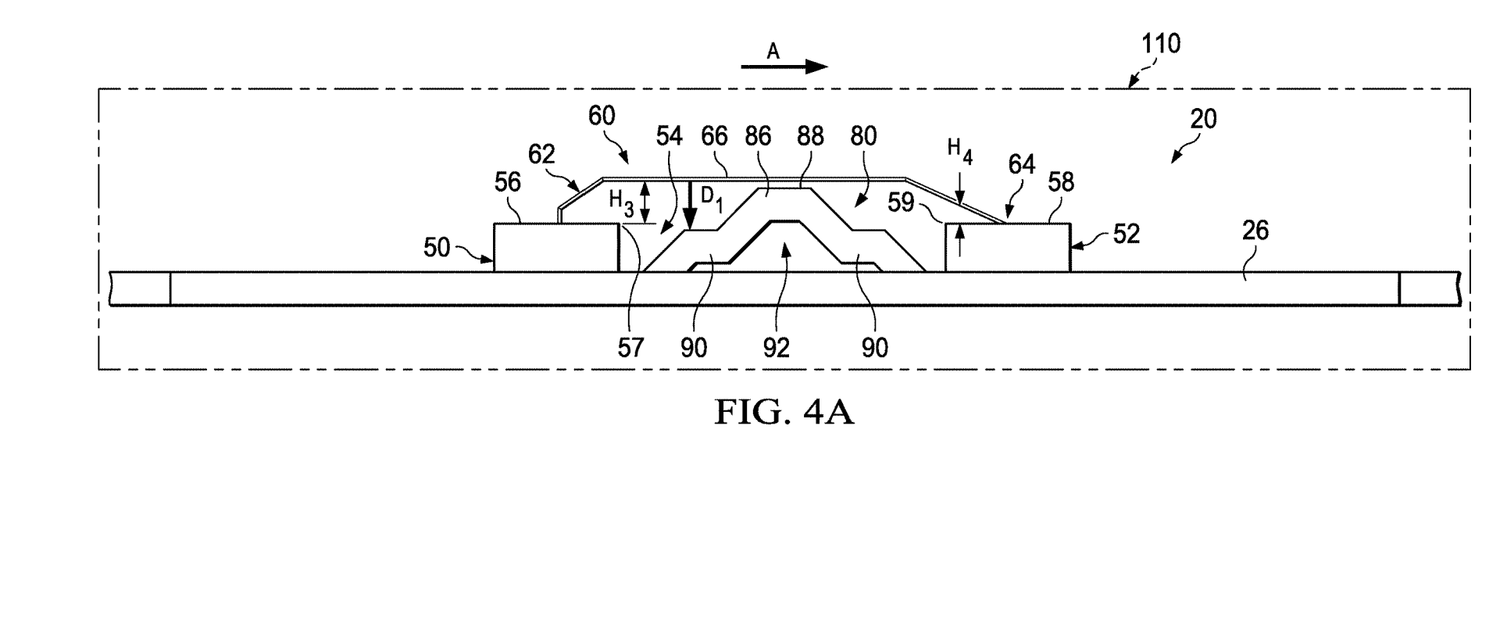
FIG. 4A illustrates the leadframe of FIG. 1 following third and four stages of manufacturing.

During manufacturing, the leadframe 20, including the support members 26 and support bracket 80, is formed first (FIGS. 2A-2C). The dies 50, 52 are then secured via epoxy to the respective die pads 32, 36 (FIG. 3). Referring to FIGS. 1 and 4A, the first end 62 of each wire 60 is electrically connected to the first die 50. The second end 64 of each wire 60 is electrically connected to the second die 52. Each wire 60 can be thermosonically bonded to both dies 50, 52. In one example, the first ends 62 are ball bonded to the first die 50 and the second ends 64 are stitch bonded to the second die 52. In any case, the wires 60 are secured to the dies 50, 52 such that the middle portions 66 of the wires 60 extend parallel to one another and over the planar surface 88 of the middle portion 86 of the support bracket 80.

Figure 4B:
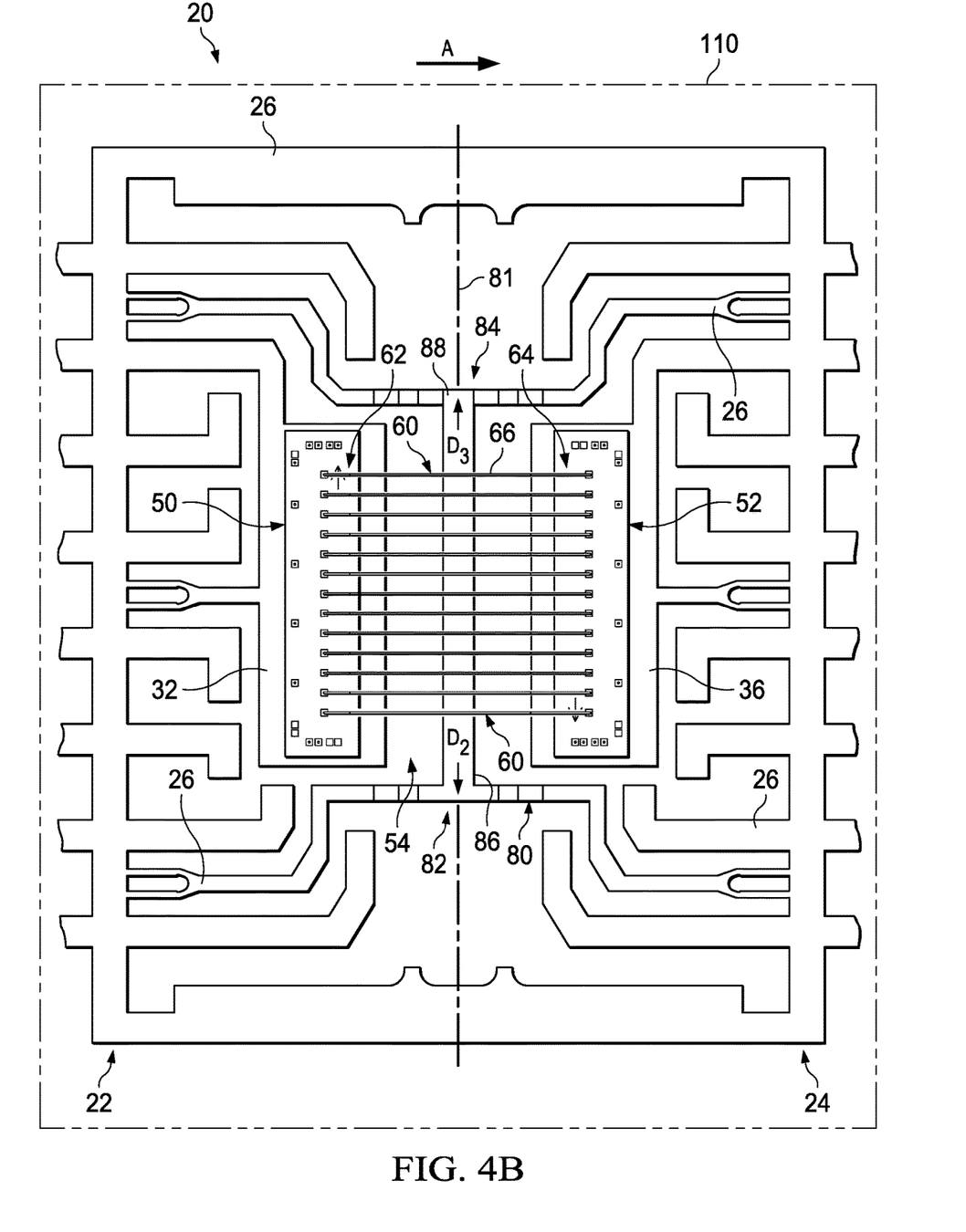
FIG. 4B is a top view of FIG. 4A.

After the wires 60 are connected to the dies 50, 52 the entire leadframe 20 is overmolded with an electrically insulating material, e.g., plastic, in the direction indicated by the arrow A in FIGS. 1, 4A and 4B and illustrated in phantom by 110. During the overmolding process, however, the force of the mold material flowing over the wires 60 can cause plastic deformation of the wires from their initial positions. For example, the mold material can urge the middle portions 66 of the wires 60 downwards towards the support members 26 in the direction $D_1$ (FIG. 4A), also known as wire sagging. Alternatively or additionally, the flowing mold material can urge the middle portions 66 of the wires 60 to move sideways in the direction $D_2$ (FIG. 4B) and/or sideways in the direction $D_3$, both known as wire sweeping.

Since the ends 62, 64 of the wires 60 are rigidly fixed to the dies 50, 52 any wire sagging or sweeping causes the wires to plastically deform. If the mold flowing forces are not counteracted and the wires 60 free to sag or sweep, the height of the wires from the edges 57, 59 of the dies 50, 52 can be reduced to below a threshold amount. When this occurs, electrical arcing can occur between the wires 60 and dies 50, 52 during use of the circuit board, which can cause damage to the circuit board and is therefore dearly undesirable.

As shown in FIGS. 4A-4B, the support bracket 80 advantageously supports the wires 60 during overmolding and helps ensure the middle portions 60 are spaced a predetermined height/spacing from dies 32, 36 during overmolding. In particular, the planar surface 88 of the middle portion 66 is positioned at the height $H_1$ relative to the first die pad 32 (see FIG. 2C) such that the first end 62 of the wire 60 maintains or stays above a minimum/predetermined height $H_3$ (FIG. 4A) relative to the edge 57 of the first die 50 during overmolding. Similarly, the planar surface 88 of the middle portion 66 is positioned at the height $H_2$ relative to the second die pad 36 (see FIG. 2C) such that the second end 62 of the wire 60 maintains or stays above a minimum/predetermined height $H_4$ (FIG. 4A) relative to the edge 57 of the first die 50 during overmolding.

The heights $H_3$, $H_4$ can be identical or different from one another depending on conditions such as the geometry of the wires 60, overmolding conditions, etc. In one example, the heights $H_3$, $H_4$ are at least about 250 μm. In any case, since the dies 50, 52 are provided on the die pads 32, 36 the support brackets 80 necessarily help ensure the ends 62, 64 of the wires 60 are maintained at or stay above predetermined distances from the respective die pads during overmolding.

The support bracket 80 achieves proper support of the wires 60 by providing an upward reaction force to the middle portions 66 of the wires 60 as the overmold urges the wires toward the leadframe 20 and/or sideways. To this end, the support bracket 80 is configured to have a stiffness that is high enough to withstand external forces thereon that cause wire sweep and wire sag during overmolding, thereby preventing the middle portions 60 from plastically deforming during overmolding.

Moreover, frictional engagement between the middle portions 66 and the planar surface 88 provides additional resistance to sideways movement of the wires 66 in the directions $D_2$, $D_3$. To this end, the solder resistant coating on the surface 88 can increase this frictional resistance. Consequently, the support bracket 80 advantageously prevents the wires 60 from sagging and sweeping to maintain the ends 62, 64 of the wires at the predetermined heights $H_3$, $H_4$ throughout overmolding—or prevent the ends 62, 64 from moving below the respective predetermined height. This helps prevent unwanted arcing during use of the circuit board and alleviates the need to x-ray inspect the overmolded leadframe for wire sag and wire sweep, thereby saving manufacturing time and cost.

Without the bracket 80, the first and second ends 62, 64 of the wires 60 would need to extend higher relative to edges 57, 59 of the dies 50, 52 to try and maintain the wires above the threshold height during overmolding and account for wire sag and wire sweep. This construction, however, is unreliable, does not constrain the wires in any way or provide reaction forces against the incoming mold flow, increases manufacturing, and material cost.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A packaged integrated circuit, comprising:
    a leadframe, comprising:
        a plurality of interconnected support members;
        a pair of die pads connected to the support members and configured to receive a pair of dies electrically connected by at least one wire having a middle portion; and
        a support bracket extending between the die pads and having a surface for maintaining the middle portion of the at least one wire no lower than a height from the die pads during overmolding of the leadframe, the height preventing electrical arcing between the dies and the at least one wire; and
    the pair of dies secured to the pair of die pads;
    the at least one wire electrically connecting the pair of dies; and
    electrically insulating material overmolded over the leadframe, the at least one wire, and the pair of dies.

2. The packaged integrated circuit recited in claim 1, wherein the support bracket includes a middle portion including the surface and spaced equidistant from the die pads.

3. The packaged integrated circuit recited in claim 1, wherein the surface of the support bracket is planar.

4. The packaged integrated circuit recited in claim 1, wherein the surface of the support bracket extends parallel to the die pads.

5. The packaged integrated circuit recited in claim 1, wherein the support bracket extends from a first end to a second end, each first and second end having a triangular shape.

6. The packaged integrated circuit recited in claim 1, wherein the support bracket is coated with a solder resistant layer.

7. The packaged integrated circuit recited in claim 1, wherein the support bracket includes a plurality of spaced apart middle portions that each includes a surface for supporting the at least one wire.

8. The packaged integrated circuit recited in claim 1, wherein the surface of the support bracket has a width of about 4 mm.

9. A circuit board, comprising:
    a leadframe, comprising:
        a plurality of interconnected support members;
        a pair of die pads connected to the support members; and
        a support bracket extending between the die pads and having a surface;
    a pair of dies secured to the die pads;
    at least one wire electrically connecting the dies together, the at least one wire having a middle portion, the surface of the support bracket supporting the middle portion of the at least one wire to maintain the at least one wire no lower than a height from the dies during overmolding of the circuit board, the height preventing electrical arcing between the dies and the at least one wire; and
    electrically insulating material overmolded over the leadframe, the at least one wire, and the pair of dies.

10. The circuit board recited in claim 9, wherein the support bracket includes a middle portion, which includes the surface and is spaced equidistant from the die pads.

11. The circuit board recited in claim 9, wherein the surface of the support bracket is planar.

12. The circuit board recited in claim 9, wherein the surface of the support bracket extends parallel to the die pads.

13. The circuit board recited in claim 9, wherein the support bracket extends from a first end to a second end, each first and second end having a triangular shape.

14. The circuit board recited in claim 9, wherein the support bracket is coated with a solder resistant layer.

15. The circuit board recited in claim 9, wherein the support bracket includes a plurality of spaced apart middle portions that each includes a surface for supporting the at least one wire.

16. The circuit board recited in claim 9, wherein the surface of the support bracket has a width of about 4 mm.

17. The circuit board recited in claim 9, wherein the support bracket spaces a first end of each wire a first height from a top edge of one of the dies and spaces a second end of each wire a second height from a top edge of the other of the dies.

* * * * *